United States Patent
De Silva et al.

(10) Patent No.: US 10,354,885 B2
(45) Date of Patent: Jul. 16, 2019

(54) HARD MASKS FOR BLOCK PATTERNING

(71) Applicant: International Business Machines Corporation, Armonk, NY (US)

(72) Inventors: Ekmini A. De Silva, Albany, NY (US); Isabel C. Estrada-Raygoza, Slingerlands, NY (US); Yann A. M. Mignot, Slingerlands, NY (US); Indira P. V. Seshadri, Troy, NY (US); Yongan Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/897,390

(22) Filed: Feb. 15, 2018

(65) Prior Publication Data
US 2018/0197745 A1   Jul. 12, 2018

Related U.S. Application Data

(62) Division of application No. 15/404,465, filed on Jan. 12, 2017, now Pat. No. 10,090,164.

(51) Int. Cl.
*H01L 29/06* (2006.01)
*H01L 21/033* (2006.01)
*H01L 21/308* (2006.01)
*H01L 21/3105* (2006.01)

(52) U.S. Cl.
CPC ...... *H01L 21/3081* (2013.01); *H01L 21/0337* (2013.01); *H01L 21/3086* (2013.01); *H01L 21/31051* (2013.01); *H01L 29/0657* (2013.01)

(58) Field of Classification Search
CPC .......... H01L 21/3086; H01L 21/31051; H01L 21/0228; H01L 29/6656; H01L 21/0337; H01L 21/0276; H01L 21/0332; H01L 21/31144; H01L 21/31116; H01L 21/31111; H01L 21/3081; H01L 29/0657
See application file for complete search history.

(56) References Cited

U.S. PATENT DOCUMENTS 9,276,013 B1 * 3/2016 Doris .................. H01L 27/1211
2015/0162277 A1 * 6/2015 Zhang ................. H01L 23/5226
257/773

OTHER PUBLICATIONS

Ekmini A. De Silva, et al.," Hard Masks for Block Patterning", U.S. Appl. No. 15/404,465, filed Jan. 12, 2017.
List of IBM Patents or Patent Applications Treated as Related; Date Filed: Feb. 15, 2018, p. 1-2.

* cited by examiner

*Primary Examiner* — Jasmine J Clark
(74) *Attorney, Agent, or Firm* — Cantor Colburn LLP; Vazken Alexanian

(57) ABSTRACT

Embodiments are directed to a method of forming a semiconductor device and resulting structures having a hard masks for sidewall image transfer (SIT) block patterning. The method includes forming a first hard mask on a substrate. Spacers are formed on the first hard mask, and a second hard mask is formed over the spacers. The second hard mask and a portion of the first hard mask are concurrently removed by the same hard mask removal process to expose a surface of the substrate. After concurrently removing the second hard mask and portions of the first hard mask, the heights of the spacers are substantially equal.

14 Claims, 5 Drawing Sheets

HARD MASKS FOR BLOCK PATTERNING

DOMESTIC PRIORITY

This application is a Divisional of U.S. patent application Ser. No. 15/404,465, filed Jan. 12, 2017, now U.S. Pat. No. 10,090,164, the disclosure of which is incorporated by reference herein in its entirety.

BACKGROUND

The present invention relates in general to semiconductor device fabrication methods and resulting structures. More specifically, the present invention relates to fabrication methods and resulting structures for a semiconductor device having separate hard masks formed from common material to facilitate sidewall image transfer (SIT) block patterning.

In contemporary semiconductor device fabrication processes, a large number of semiconductor devices, such as field effect transistors (FETs) and on-chip capacitors, are fabricated on a single wafer. Some non-planar device architectures, such as vertical field effect transistors (VFETs), employ semiconductor fins and side-gates that can be contacted outside the active region, resulting in increased device density and some increased performance over lateral devices. There are challenges, however, in providing non-planar architectures for scaling beyond the 10 nm node. One technique for increasing device density is to double spacer pattern density through a technique called sidewall image transfer (SIT), also known as sidewall spacer image transfer.

SUMMARY

According to one or more embodiments of the present invention, a method of fabricating a semiconductor device having hard masks for SIT block patterning is provided. The method includes forming a first hard mask on a substrate. Spacers are formed on the first hard mask, and a second hard mask is formed over the spacers. The second hard mask and portions of the first hard mask are concurrently removed by the same hard mask removal process to expose a surface of the substrate. After concurrently removing the second hard mask and portions of the first hard mask, the heights of the spacers are substantially equal.

According to one or more embodiments of the present invention, a method of fabricating a semiconductor device having hard masks for SIT block patterning is provided. The method includes forming a first hard mask on a substrate. A first spacer is formed in a first region on the first hard mask, and a second spacer is formed in a second region on the first hard mask. The method further includes forming a gap filling layer over and between the first and second spacers and forming a second hard mask on the gap filling layer. A first portion of the second hard mask is over the first spacer in the first region and a second portion of the second hard mask is over the second spacer in the second region. The method further includes removing the second portion of the second hard mask to expose a surface of the gap filling layer in the second region and removing a portion of the gap filling layer in the second region to expose a portion of the first hard mask. The method further includes removing the first portion of the second hard mask and the exposed portion of the first hard mask such that a height of the first spacer after removing the first portion of the second hard mask is substantially equal to a height of the second spacer.

According to one or more embodiments of the present invention, a semiconductor device having hard masks for SIT block patterning is provided. The structure includes a planarization layer formed on a substrate. The structure further includes a dielectric layer formed on the planarization layer and a hard mask formed on the dielectric layer. The hard mask is patterned to expose a surface of the dielectric layer in a first region. The structure further includes a first plurality of spacers on the hard mask in the first region, a second plurality of spacers on the hard mask in a second region, and a gap filling layer over and between the second plurality of spacers. A height of each spacer of the first plurality of spacers is substantially equal to a height of each spacer of the second plurality of spacers.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
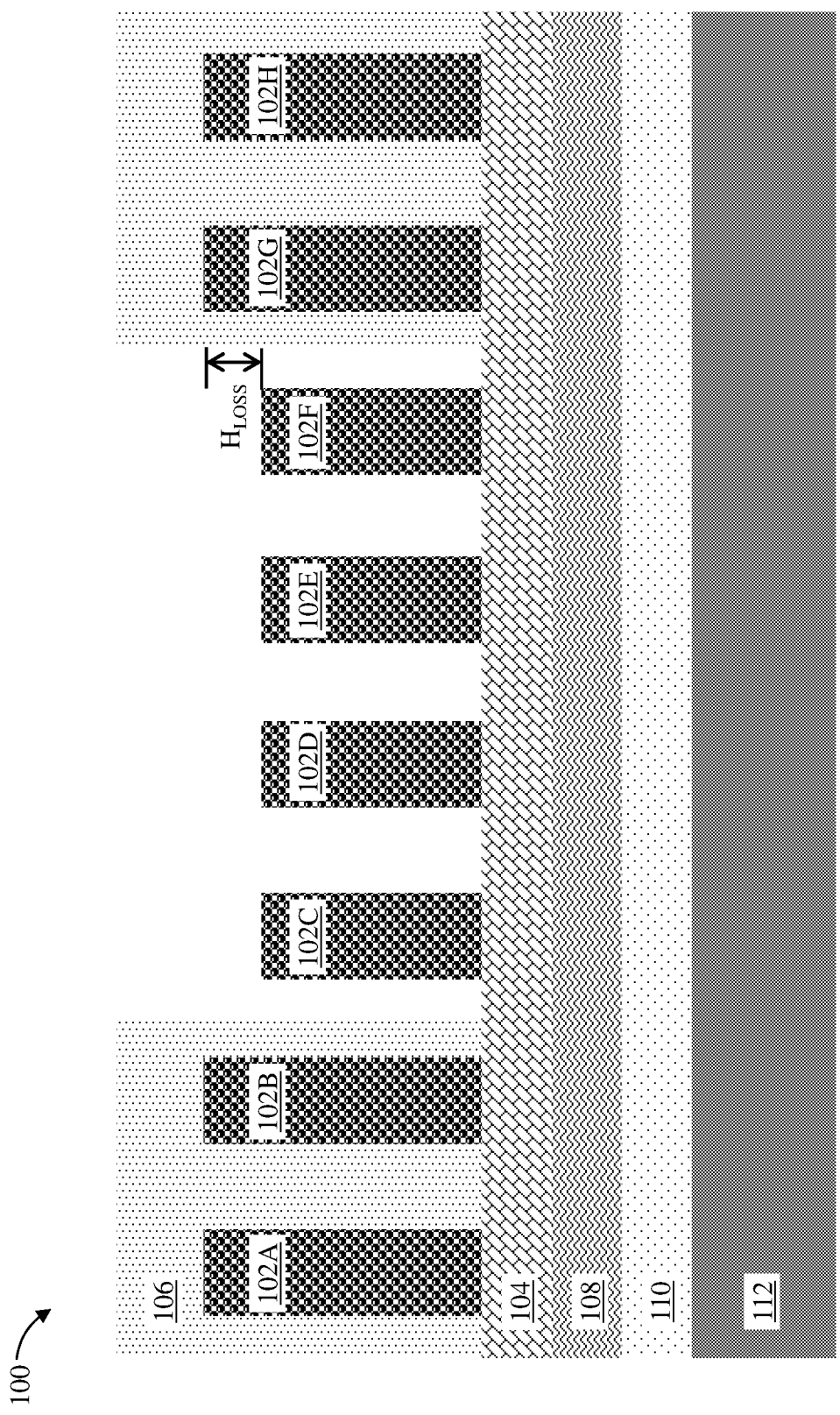
FIG. 1 depicts a cross-sectional view of a structure having spacers formed on a hard mask during an intermediate operation of a conventional method of fabricating a semiconductor device following a silicon containing antireflective coating (SiARC) burn off.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B"

include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" means that the thickness of, e.g., a conformal liner, is substantially the same on all surfaces, or that the thickness variation is less than 15% of the nominal thickness.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to aspects of the present invention, as previously noted herein, one technique for scaling non-planar architectures beyond the 10 nm node is to double spacer pattern density through SIT. Conventional SIT processes employ a SiARC layer to form spacers next to photo-resist mandrels. One challenge in the conventional SIT process is the loss of oxide spacer thickness and height for spacers located in an exposed region (i.e., open area spacers) during the block patterning process SiARC layer burn off. SiARC burn off is necessary to remove the SiARC layer after spacer formation. Conventionally, SiARC burn off is achieved by exposing the SiARC layer to a plasma environment including, for example, fluorocarbon gas (e.g., $CF_4$, $C_4F_8$) or hydrogenated fluorocarbon gas (e.g., $CH_xF_y$). This variation in spacer height between spacers located in the exposed region and spacers protected by a hard mask (i.e., block area spacers) creates topography issues during via patterning and over etching/gouging in areas having reduced height spacers. Thus, a method is desired for forming a semiconductor device without the need for an additional burn off step.

Turning now to an overview of the aspects of the present invention, one or more embodiments described herein provide methods of fabricating a semiconductor device having separate hard masks formed from common material to facilitate SIT block patterning. Forming the hard masks from common material allows for the hard masks to be removed during a single hard mask open process without the need for an additional hard mask burn off. Consequently, spacer thickness and height uniformity can be achieved in both open and block areas even for a tight spacer pitch. Moreover, this approach allows for a smaller spacer size (i.e., a spacer height of less than about 20 nm) as there is no need to oversize the spacers to compensate for spacer loss due to burn off. In some embodiments, a Ti hard mask replaces the conventional SiARC layer and can be formed using, for example, deposition or spin coating to a thickness of about 30 angstroms to about 150 angstroms. The Ti hard mask can be removed during a titanium nitride (TiN) hard mask open step without the need for an additional hard mask burn off.

Example methods for fabricating a semiconductor device having a Ti hard mask for SIT block patterning and the resulting structures therefrom in accordance with embodiments of the present invention are described in detail below by referring to the accompanying drawings in FIGS. 1-5.

FIG. 1 illustrates a cross-sectional view of a structure 100 having spacers 102A-H formed on a hard mask 104 during an intermediate operation of a conventional method of fabricating a semiconductor device following a SiARC burn off. Spacers 102A, 102B, 102G, and 102H are in a block area protected by a gap filling layer 106. Spacers 102C-F are exposed in an open area. The structure 100 also includes a first planarization layer 108, a dielectric layer 110, and a substrate 112, configured and arranged as shown. The SiARC burn off (not depicted) has reduced the height of the open area spacers 102C-F. This loss in height has caused a height difference $H_{LOSS}$ between the open area spacers 102C-F and the block area spacers 102A, 102B, 102G, and 102H.

Figure 2:
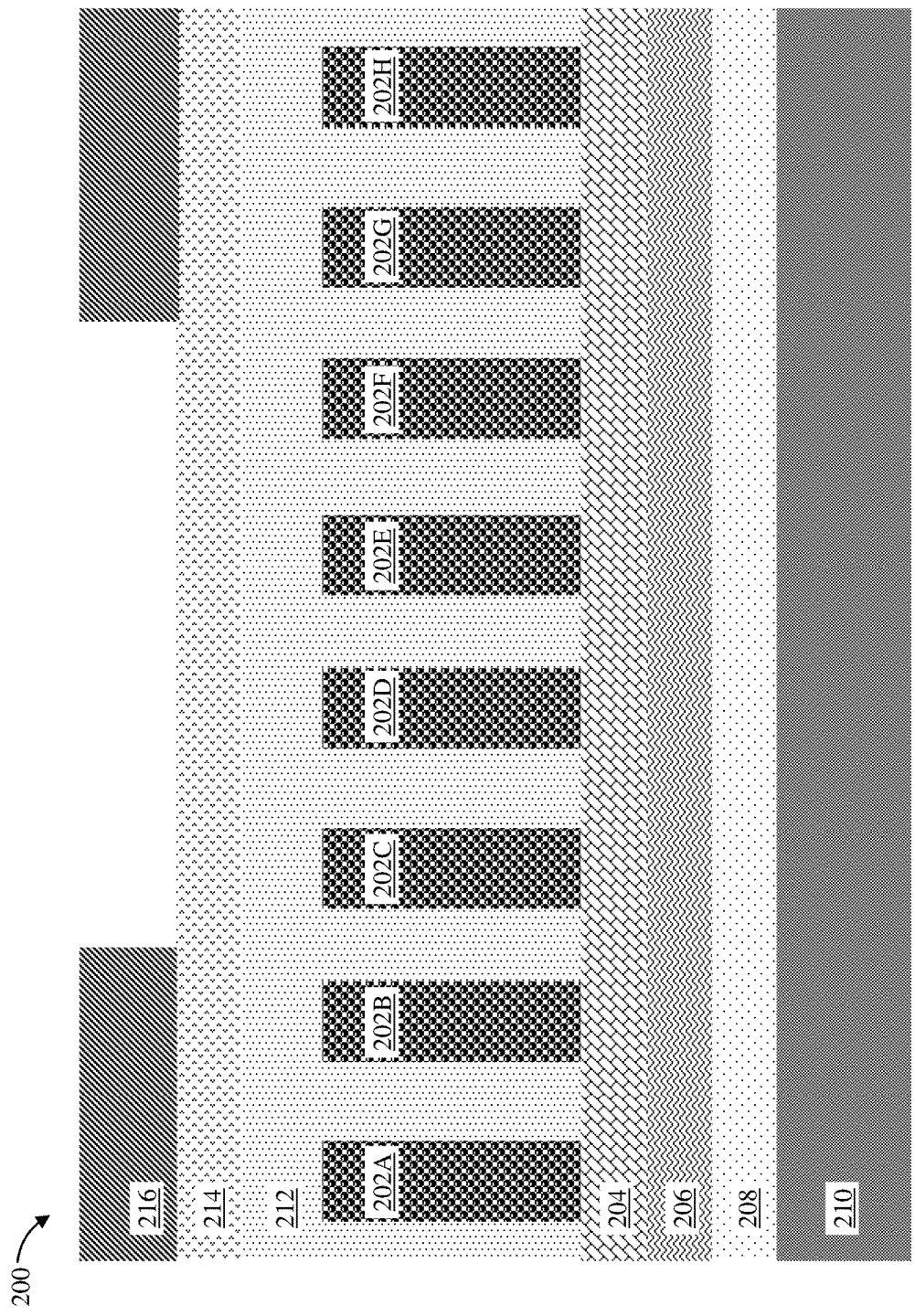
FIG. 2 depicts a cross-sectional view of a structure having spacers formed on a hard mask during an intermediate operation of a method of fabricating a semiconductor device according to one or more embodiments of the present invention.

FIG. 2 illustrates a cross-sectional view of a structure 200 having spacers 202A-H formed on a hard mask 204 during an intermediate operation of a method of fabricating a semiconductor device according to one or more embodiments of the present invention. For ease of discussion reference is made to operations performed on and to a structure having eight adjacent spacers. It is understood, however, that the structure 200 can include any number of spacers. In some embodiments, the spacer pitch, or centerline to centerline spacing, between each pair of adjacent spacers (e.g., between spacers 202B and 202C) can be less than about 100 nm. In other embodiments, the spacer pitch is less than about 50 nm, or less than about 20 nm, or less than about 10 nm. In some embodiments, the spacer pitch between each pair of adjacent spacers is substantially equal.

The spacers 202A-H can be formed on the hard mask 204 using known SIT techniques to achieve sub-80 nm pitch patterning. For example, in some embodiments, the spacers 202A-H are formed on the sidewalls of lithographically patterned sacrificial mandrels (not depicted). The spacers 202A-H can be made of any suitable material, such as, for example, a silicon nitride, silicon dioxide, a silicon oxynitride (SiON), a silicon carbide (SiC), a silicon oxygen carbonitride (SiOCN), a silicoboron carbonitride (SiBCN), or other dielectric materials.

The hard mask 204 can be made of any suitable material, such as, for example, a nitride, a silicon nitride, a metal nitride (e.g., TiN and boron nitride), or a metal oxide (e.g., $TiO_xN_y$) and can have a thickness of about 5 nm to about 50 nm. In some embodiments, hard mask 204 is a TiN layer having a thickness of about 25 nm.

In some embodiments, the hard mask 204 is formed on a first planarization layer 206. The first planarization layer 206 can be made of any suitable material, such as, for example, tetraethyl orthosilicate (TEOS) or amorphous carbon and can have a thickness of about 10 nm to about 100 nm. In some embodiments, the first planarization layer 206 is a TEOS layer having a thickness of about 30 nm.

In some embodiments, the first planarization layer 206 is formed on a dielectric layer 208. The dielectric layer 208 can be made of any suitable material, such as, for example, a low-k dielectric, a silicon nitride, silicon dioxide, SiON, SiC, SiOCN, SiBCN, or other dielectric materials and can have a thickness of about 10 nm to about 100 nm. Any known manner of forming the dielectric layer 208 can be utilized. The dielectric layer 208 can be formed using, for example, CVD, PECVD, ALD, flowable CVD, spin-on dielectrics, or PVD. In some embodiments, the dielectric layer 208 is formed by a flowable silicon nitride deposition. In some embodiments, the dielectric layer 208 is a silicon dioxide layer having a thickness of about 30 nm. In some embodiments, the dielectric layer 208 is planarized, using, for example, a CMP operation.

In some embodiments, the dielectric layer 208 is formed on a substrate 210. The substrate 210 can be any suitable substrate material, such as, for example, monocrystalline Si, SiGe, SiC, III-V compound semiconductor, II-VI compound semiconductor, or semiconductor-on-insulator (SOI). In some embodiments, the substrate 210 includes a buried oxide layer (BOX).

A gap filling layer 212 is formed over the spacers 202A-H to fill in the space between each pair of adjacent spacers (e.g., between spacers 202A and 202B). In some embodiments, the gap filling layer 212 is planarized, using, for example, a CMP operation. The gap filling layer 212 can be made of any suitable material, such as, for example, tetraethyl orthosilicate (TEOS) or amorphous carbon and can have a thickness of about 10 nm to about 150 nm.

In some embodiments, a hard mask 214 is formed on the gap filling layer 212. The hard mask 214 can be formed using any suitable process, such as, for example, deposition or spin coating. In some embodiments, the hard mask 214 is formed using a spin coating process at a temperature of less than about 350 degrees Celsius. The hard mask 214 can be made of any suitable material, such as, for example, titanium, a metal nitride (e.g., titanium nitride), titanium containing ARC (TiARC), a metal oxide (e.g., TiOx), or other suitable metal nitrides and can have a thickness of about 1 nm to about 30 nm.

Figure 5:
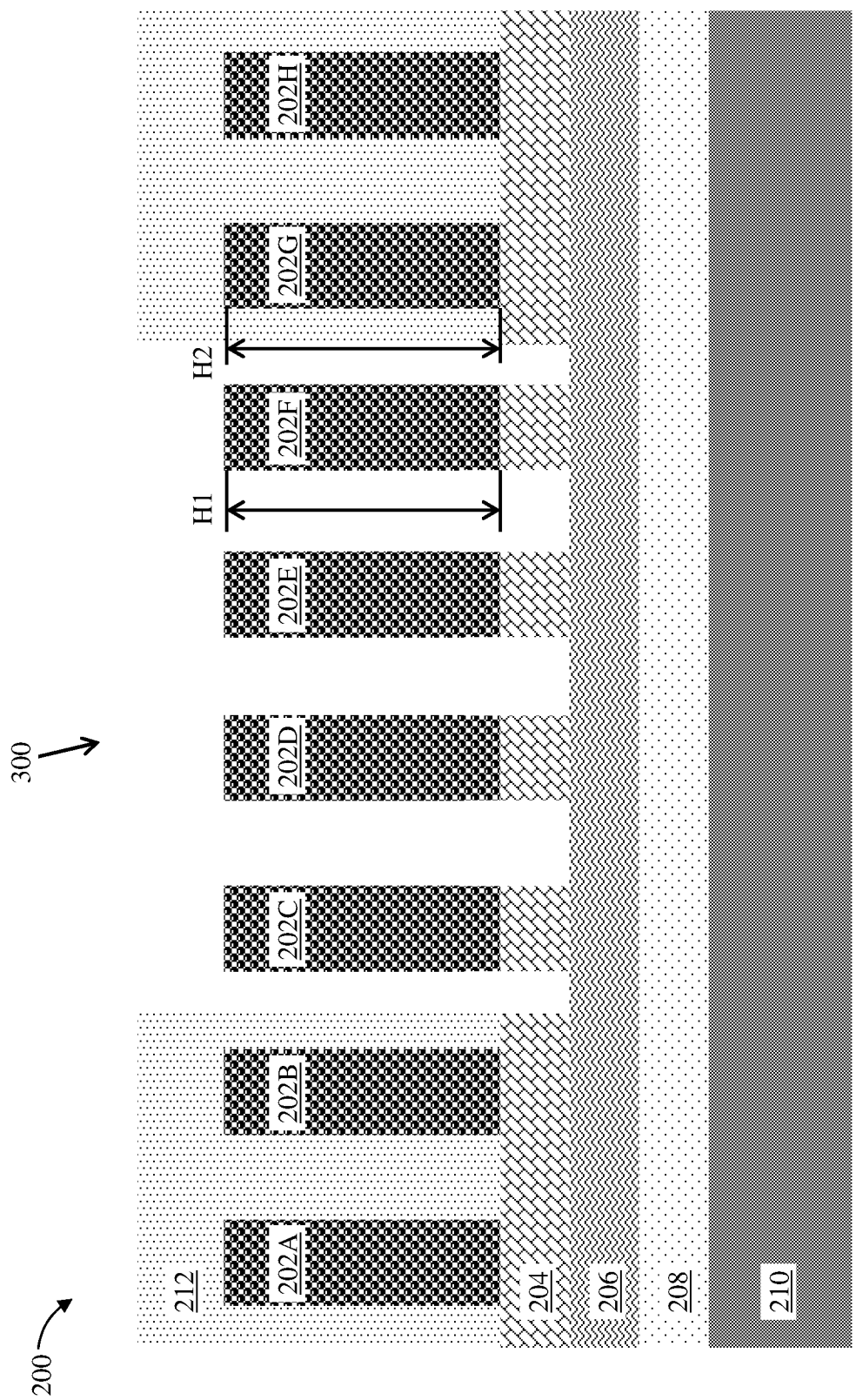
FIG. 5 depicts a cross-sectional view of the structure after removing portions of the hard mask in the open region to expose portions of a first planarization layer during an intermediate operation of a method of fabricating a semiconductor device according to one or more embodiments of the present invention.

In some embodiments, the hard mask 214 is a Ti hard mask (e.g., titanium, TiN, TiARC, or TiOx) having a thickness of about 3 nm to about 15 nm. In some embodiments, the hard mask 214 is a Ti hard mask and the hard mask 204 is a TiN hard mask. In this manner, the hard mask 214 can be removed concurrently (i.e., substantially simultaneously) with the hard mask 204 during a single hard mask open (i.e., wet or dry etch) process (as depicted in FIG. 5). In some embodiments, the hard mask 214 is a Ti hard mask having a carbon content of about 10 percent to about 20 percent to increase hydrophobicity. In this manner, the composition of the hard mask 214 can be tuned to improve adhesion (i.e., to enable resist patterning directly on the hard mask) and the lithography process window.

In some embodiments, a material of the hard mask 214 is selected to tune a refractory index of the hard mask 214 to a value of about 1.5 to about 1.7 and an absorbance value of the hard mask 214 to a value of about 0.1 to about 0.4. In this manner, the refractory index and absorbance value of the hard mask 214 can be tuned to improve the simultaneous removable of the hard mask 214 and the hard mask 204.

In some embodiments, the hard mask 214 is lithographically patterned using a photoresist 216. The photoresist 216 can be made of any appropriate type of photo-resist material, which can partly depend upon the device patterns to be formed and the exposure method used. For example, photoresist 216 can include an extreme ultraviolet (EUV) resist suitable for an optical process. Photoresist 216 can be formed to have a thickness ranging from about 30 nm to about 150 nm. In some embodiments, a thin organic layer (not depicted), such as, for example, bottom ARC (BARC) can be deposited on top of the hard mask 214 to improve adhesion to the photoresist 216.

Figure 3:
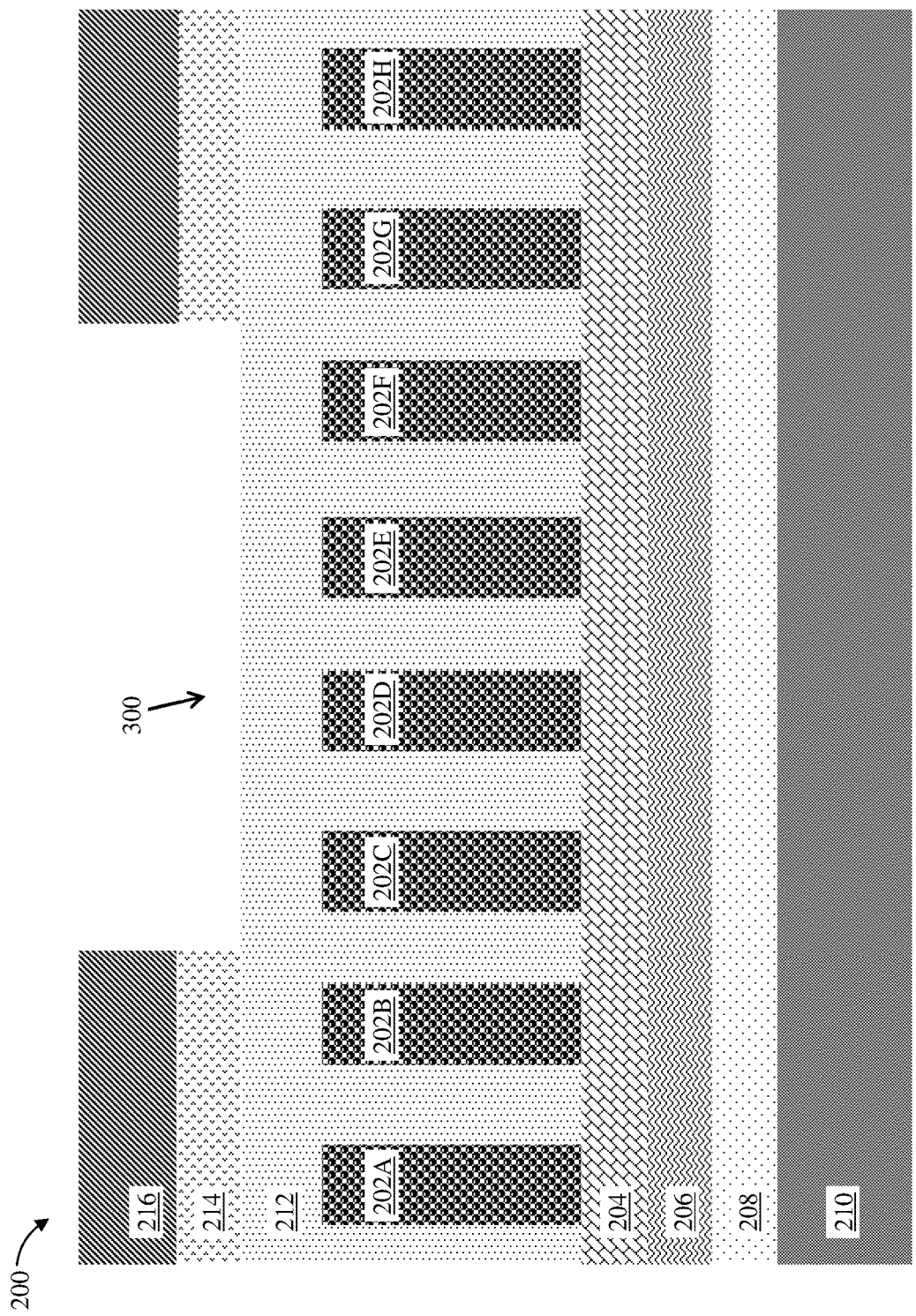
FIG. 3 depicts a cross-sectional view of the structure after patterning the hard mask to form an open region and expose a surface of a gap filling layer during an intermediate operation of a method of fabricating a semiconductor device according to one or more embodiments of the present invention.

FIG. 3 illustrates a cross-sectional view of the structure 200 after patterning the hard mask 214 to form an open region 300 and expose a surface of the gap filling layer 212 during an intermediate operation of a method of fabricating a semiconductor device according to one or more embodiments. The hard mask 214 can be patterned with the photoresist 216 using known photolithographic methods followed by, for example, a wet or dry etch. Spacers 202A, 202B, 202G, and 202H are protected by the patterned hard mask 214 (i.e., in a block area). Spacers 202C-F are exposed in the open area 300.

Figure 4:
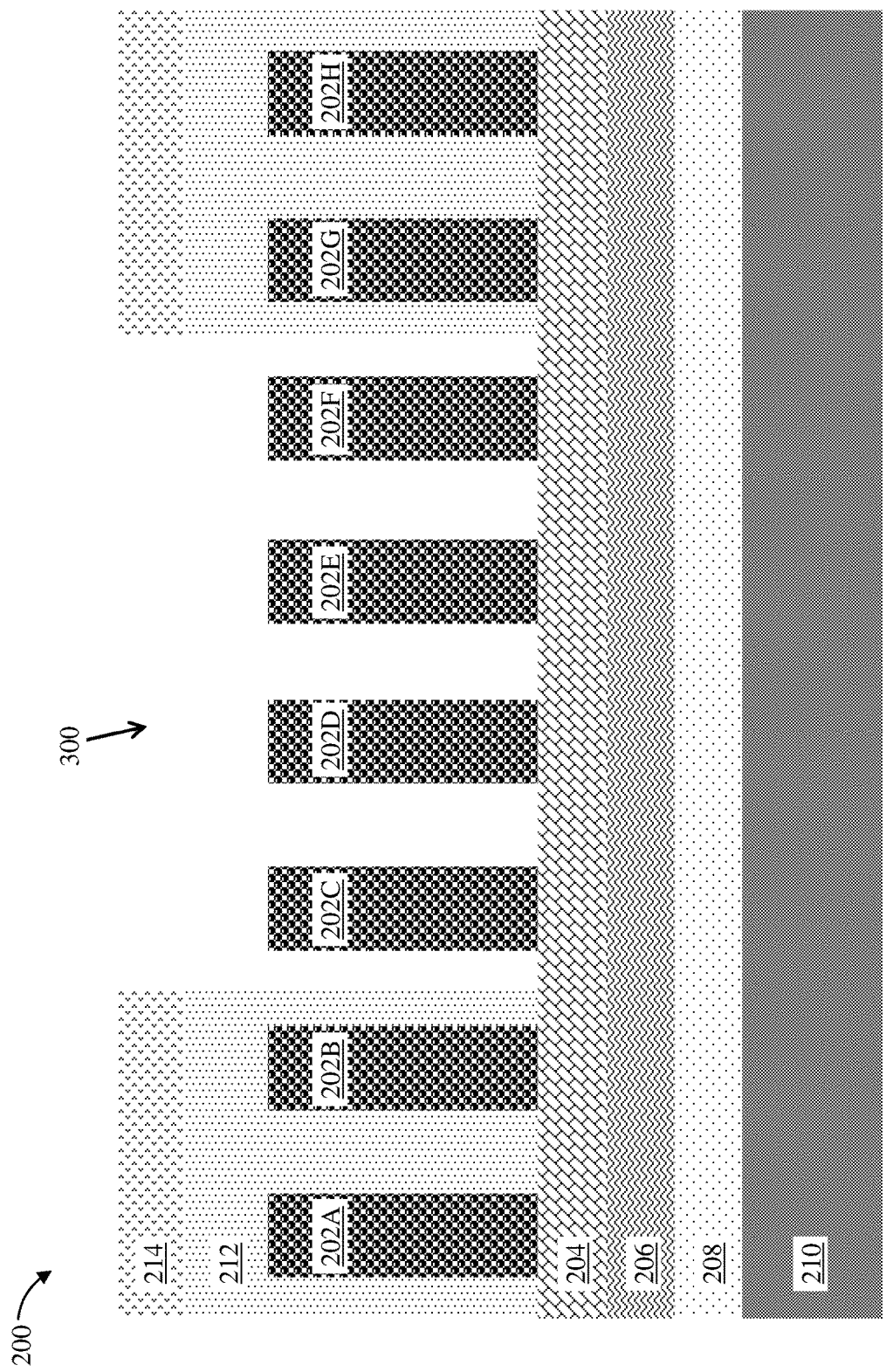
FIG. 4 depicts a cross-sectional view of the structure after removing portions of the gap filling layer in the open region to expose portions of the hard mask during an intermediate operation of a method of fabricating a semiconductor device according to one or more embodiments of the present invention.

FIG. 4 illustrates a cross-sectional view of the structure 200 after removing portions of the gap filling layer 212 in the open region 300 to expose portions of the hard mask 214 during an intermediate operation of a method of fabricating a semiconductor device according to one or more embodiments. Any known manner of removing portions of the gap filling layer 212 can be utilized, such as, for example, a wet or dry etch. In some embodiments, the gap filling layer 212 is etched selective to the spacers 202C-F, the hard mask 214, and the hard mask 204. In some embodiments, portions of the gap filling layer 212 are removed using RIE selective to the hard mask 204. The photoresist 216 can be removed while patterning the gap filling layer 212.

FIG. 5 illustrates a cross-sectional view of the structure 200 after removing portions of the hard mask 204 in the open region 300 to expose portions of the first planarization layer 206 during an intermediate operation of a method of fabricating a semiconductor device according to one or more embodiments. In some embodiments, the hard mask 214 is removed simultaneously with the hard mask 204 during a single hard mask open process. Any known manner of removing portions of the hard mask 204 and the hard mask 214 can be utilized, such as, for example, a wet or dry etch. In some embodiments, the hard masks 204 and 214 are etched selective to the spacers 202C-F. In some embodiments, the hard masks 204 and 214 are removed using RIE selective to the spacers 202C-F and the first planarization layer 206. The etch parameters (e.g., duration, etch rate, etchant, etc.) of the hard mask open process according to embodiments of the present invention are chosen to ensure that the hard mask open process opens areas of the hard mask 204 and completely removes the hard mask 214.

Removing both hard masks 204 and 214 using a single hard mask open process obviates the need for removing the hard mask 214 using a subsequent and separate hard mask burn off. As described previously herein, a conventional SIT block patterning process having a SiARC layer requires SiARC burn off, which is achieved by exposing the SiARC layer to a plasma environment including, for example, fluorocarbon gas (e.g., $CF_4$, $C_4F_8$) or hydrogenated fluorocarbon gas (e.g., $CH_xF_y$). The SiARC burn off damages exposed spacers (i.e., reduces the height of the exposed spacers). Consequently, the use of a single hard mask open process allows for the height H1 of the spacers 202C-F in the open region 300 to be preserved (i.e., the height H1 of the spacers is not reduced by burn off) after the single hard mask open process. In some embodiments, the hard masks 204 and 214 can be removed selective to the spacers 202A-H. In this manner, the height H1 of the spacers 202C-F is substantially the same as the height H2 of the spacers 202A, 202B, 202G, and 202H (i.e., in the block area) following the single hard mask open process. In some embodiments, the height H1 of the spacers 202C-F and the height H2 of the spacers 202A, 202B, 202G, 202H are substantially equal and less than about 20 nm.

As previously noted herein, in some embodiments, the hard mask 214 is a Ti hard mask (e.g., titanium, TiN, TiARC, or TiOx) having a thickness of about 3 nm to about 15 nm. In some embodiments, the hard mask 214 is a Ti hard mask and the hard mask 204 is a TiN or $TiO_xN_y$ hard mask. In this manner, the hard mask 214 can be removed concurrently (i.e., substantially simultaneously) with the hard mask 204 during a single hard mask open (i.e., wet or dry etch) process (as depicted in FIG. 5). In some embodiments, the hard mask 214 is a Ti hard mask having a carbon content of about 10 percent to about 20 percent to increase hydrophobicity. In this manner, the composition of the hard mask 214 can be tuned to improve adhesion (i.e., to enable resist patterning directly on the hard mask) and the lithography process window. In some embodiments, a material of the hard mask 214 is selected to tune a refractory index of the hard mask 214 to a value of about 1.5 to about 1.7 and an absorbance value of the hard mask 214 to a value of about 0.1 to about 0.4. In this manner, the refractory index and absorbance value of the hard mask 214 can be tuned to improve the simultaneous removable of the hard mask 214 and the hard mask 204.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   a dielectric layer formed on a substrate;
   a planarization layer formed on the dielectric layer;
   a hard mask formed on the dielectric layer, the hard mask patterned to expose a surface of the dielectric layer in a first region;
   a first plurality of spacers on the hard mask in the first region and a second plurality of spacers on the hard mask in a second region; and
   a gap filling layer over and between the second plurality of spacers;
   wherein a height of each spacer of the first plurality of spacers is substantially equal to a height of each spacer of the second plurality of spacers.

2. The semiconductor device of claim 1, wherein a height of the first plurality of spacers is less than about 20 nm.

3. The semiconductor device of claim 1, wherein a centerline to centerline pitch between each of the first plurality of spacers is less than about 40 nm.

4. The semiconductor device of claim 1, wherein reactive ion etching (RIE) is used to pattern of the hard mask.

5. The semiconductor device of claim 4, wherein the RIE is selective to the first plurality of spacers.

6. The semiconductor device of claim 4, wherein the RIE is selective to the planarization layer.

7. The semiconductor device of claim 4, wherein the RIE is selective to the first plurality of spacers and the second plurality of spacers.

8. The semiconductor device of claim 1, wherein the gap filling layer is etched selective to the first plurality of spacers.

9. The semiconductor device of claim 1, wherein the first plurality of spacers are not exposed to a hard mask burn off.

10. The semiconductor device of claim 1, wherein the hard mask is comprised of: a nitride, a silicon nitride, a metal nitride or a metal oxide.

11. The semiconductor device of claim 10, wherein the hard mask is comprised of a titanium nitride (TiN) layer.

12. The semiconductor device of claim 11, wherein the TiN layer has a thickness of about 25 nm.

13. The semiconductor device of claim 1, wherein the first plurality of spacers reside in an open area and the second plurality of spacers reside in a block area.

14. The semiconductor device of claim 1, wherein at least a portion of the mask is removed concurrently with a removal of another mask.

* * * * *